(12) United States Patent
Huang et al.

(10) Patent No.: US 6,700,204 B2
(45) Date of Patent: Mar. 2, 2004

(54) SUBSTRATE FOR ACCOMMODATING PASSIVE COMPONENT

(75) Inventors: Chien-Ping Huang, Hsinchu (TW); Chien-Te Chen, Feng Yuan (TW)

(73) Assignee: Siliconware Precision Industries Co., Ltd. (TW)

( * ) Notice: Subject to any disclaimer, the term of this patent is extended or adjusted under 35 U.S.C. 154(b) by 0 days.

(21) Appl. No.: 10/038,732

(22) Filed: Jan. 2, 2002

(65) Prior Publication Data

US 2003/0096089 A1 May 22, 2003

(30) Foreign Application Priority Data

Nov. 21, 2001 (TW) ......................................... 90128795 A

(51) Int. Cl.[7] .......................... H01R 23/48; H01R 12/04
(52) U.S. Cl. ........................ 257/774; 257/776; 257/779; 174/261; 361/760; 361/774; 361/777; 228/180.21
(58) Field of Search .............................. 257/774, 776, 257/779; 174/261; 361/760, 774, 777; 228/180.21

(56) References Cited

U.S. PATENT DOCUMENTS

| | | | | |
|---|---|---|---|---|
| 5,311,405 A | | 5/1994 | Tribbey et al. ............. | 361/767 |
| 5,523,920 A | * | 6/1996 | Machuga et al. ........... | 361/767 |
| 6,115,262 A | * | 9/2000 | Brunner et al. ............. | 361/774 |
| 6,156,484 A | * | 12/2000 | Bassous et al. ............. | 430/313 |
| 6,194,667 B1 | * | 2/2001 | Jimarez et al. ............. | 174/261 |
| 6,218,630 B1 | * | 4/2001 | Takigami .................... | 174/261 |

* cited by examiner

*Primary Examiner*—Cathy Lam
(74) *Attorney, Agent, or Firm*—Peter F. Corless; Steven M. Jensen; Edwards & Angell, LLP

(57) ABSTRACT

A substrate for accommodating a passive component is proposed, including a core layer defined with a chip attach area and a trace forming area surrounding the chip attach area, with a solder mask layer being applied on the trace forming area. At least a pair of solder pads are formed on the trace forming area, and partly exposed to outside of the solder mask layer. The solder pads are each formed at a central position with an recess, allowing the core layer to be partly exposed through the recesses of the solder pads. For bonding a passive component to the solder pads, solder paste soldered on the solder pads forms a recessed top surface due to surface tension of the solder paste, and generates a downward and convergent dragging force for properly positioning the passive component on the solder pads without producing shifting or tombstone effect.

8 Claims, 3 Drawing Sheets

SUBSTRATE FOR ACCOMMODATING PASSIVE COMPONENT

FIELD OF THE INVENTION

The present invention relates to substrates for use in semiconductor packages, and more particularly, to a substrate for accommodating chips and passive components in a semiconductor package.

BACKGROUND OF THE INVENTION

With improvement in functionality and processing speed of electronic products, it increasingly desires to integrate a semiconductor package with passive components such as capacitor, resistor or inductor, so as to raise or stabilize electricity and functions of the electronic products. However, in response to profile miniaturization of the electronic products, area on a substrate for accommodating the passive components is accordingly getting reduced in the semiconductor package. Therefore, how to desirably incorporate sufficient passive components on the limited area of the substrate but not to adversely affect the trace routability of the substrate, is a critical problem to solve in the semiconductor industry.

Normally, solder paste is applied on solder pads on a substrate, for allowing a passive component to be bonded and electrically connected to the solder pads by the solder paste in proceeding of a reflow soldering process. During reflow soldering, thermally-induced variation in surface tension makes the solder paste in the solder pads swell up to form a bulged surface; this undesirably causes shifting or floating effect on the passive component, which effect is severe especially for those decreasingly dimensioned passive components. Once the passive component is shifted in position, it easily comes into contact with other nearby elements or bonding wires in a restricted space; this therefore results in the short circuit problem. Another problem often occurring during reflow is tombstone effect of the passive component. Once the passive component is positionally erected as dragged by the solder paste, it cannot be properly electrically connected to the solder pads on the substrate, thereby leading to degradation in electricity quality of fabricated products.

Accordingly, U.S. Pat. No. 5,311,405 entitled "Method and Apparatus for Aligning and Attaching a Surface Mount Component" renders solutions for the foregoing shifting and tombstone problems. In this prior art, a passive component has its two ends respectively attached to two opposing solder pads, and each of the solder pads is composed of an elliptic portion and a conical portion connected to the elliptic portion, with the conical portions of the two solder pads facing each other. Solder paste is applied onto the elliptic portions of the solder pads for attaching the two ends of the passive component thereto. In a reflow soldering process, the solder paste flows from the elliptic portions to the conical portions of the solder pads; this generates a dragging force for recovering the passive component back to the right position, and makes a longitudinal axis of the passive component aligned with an imaginary line that passes through centers of the two solder pads, so that the passive component can be free of position shifting concern during reflow.

However, there are several drawbacks for the foregoing disclosure of U.S. Pat. No. 5,311,405. First, two solder pads are necessarily formed in an elliptic shape for disposing the two ends of the passive component thereon, thereby making the area of the substrate more occupied by the two solder pads than the use of conventional solder pads; this undesirably affects the trace routability of the substrate, and is definitely not advantageous for profile miniaturization of the substrate. Moreover, since the conical portions of the two solder pads are closely spaced to each other, short circuit easily occurs due to the solder paste leaking out of the conical portions and making the solder pads be in electrical contact with each other. One solution is to increase the distance between the two solder pads; however, this results in more area on the substrate being occupied by the solder pads, and makes trace routing on the substrate more difficult to implement, as well as even needs to undesirably increase the size of the substrate. Furthermore, since the passive component is attached to the solder pads by using the solder paste, if the amount of solder paste is not evenly applied to the solder pads respectively, the passive component may suffer uneven dragging force from the solder paste during reflow, and then is easily subjected to tombstone effect. In addition, shape and structure of the solder pads used in the foregoing patent cannot be achieved simply by utilizing conventional equipment and processes, and a conventional stencil for applying the solder paste is also not suitably adopted; therefore, costs and process complexity in fabrication would be undesirably increased.

SUMMARY OF THE INVENTION

A primary objective of the present invention is to provide a substrate for accommodating a passive component, which can effectively prevent the occurrence of position shifting or tombstone effect on the passive component during bonding the passive component onto the substrate.

Another objective of the invention is to provide a substrate for accommodating a passive component, which can effectively prevent the occurrence of position shifting or tombstone effect on the passive component, without affecting the trace routability of the substrate or increasing the usage area on the substrate.

A further objective of the invention is to provide a substrate for accommodating a passive component, which can effectively prevent the occurrence of position shifting or tombstone effect on the passive component, and use currently available equipment and processes for bonding the passive component onto the substrate.

In accordance with the above and other objectives, the present invention proposes a substrate for accommodating a passive component, comprising: a core layer having a surface being formed with a chip attach area for mounting a chip thereon, and a trace forming area surrounding the chip attach area for disposing a plurality of conductive traces on the trace forming area; a solder mask layer applied onto the trace forming area, for hermetically encapsulating the conductive traces; and at least a pair of solder pads formed on the trace forming area and partly exposed to outside of the solder mask layer, each of the solder pads being formed with a central recess at least at a central position thereof, allowing the core layer to be partly exposed through the central recesses of the solder pads. During a reflow soldering process for bonding a passive component onto the solder pads by means of solder paste, the solder paste comes into contact with the exposed part of the core layer through the central recesses of the solder pads. Since the solder paste is not wettable with the material for making the core layer, it forms a recessed top surface due to surface tension of the solder paste, and thereby generates a downward and convergent dragging force for concentrating the solder paste at central positions of the solder pads, which dragging force can thus securely position the passive component above the solder pads without producing shifting or tombstone effect.

Besides the central recess, each of the solder pads can also be formed with at least a pair of rib-like recesses that are symmetrically positioned in association with the central recess and extend toward a periphery of the solder pad; which rib-like recesses can further help enhance the downward and convergent dragging force generated by the movement of the solder paste. The central recess is not particularly limited in shape; circular or rectangular shape is also suitably applicable. And, the central recess is not particularly dimensioned, with the only requisite of not interfering with electrical connection between the passive component and the solder pads. In addition, the central recess is dimensionally equal to or larger than the rib-like recesses in diameter, depending on practical requirements.

BRIEF DESCRIPTION OF THE DRAWINGS

The present invention can be more fully understood by reading the following detailed description of the preferred embodiments, with reference made to the accompanying drawings, wherein.

DETAILED DESCRIPTION OF THE PREFERRED EMBODIMENT

Figure 1:
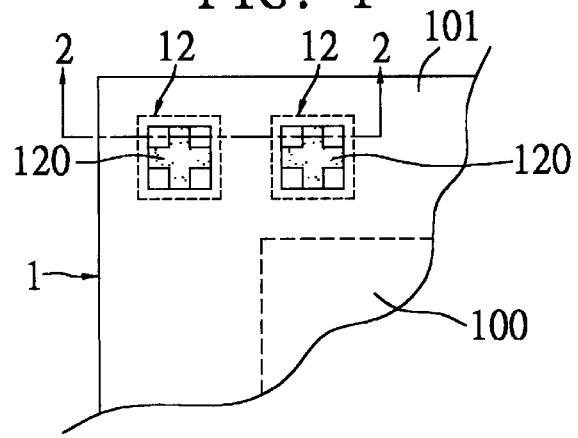
FIG. 1 is a top view of a substrate of a first preferred embodiment of the invention.
Figure 2:
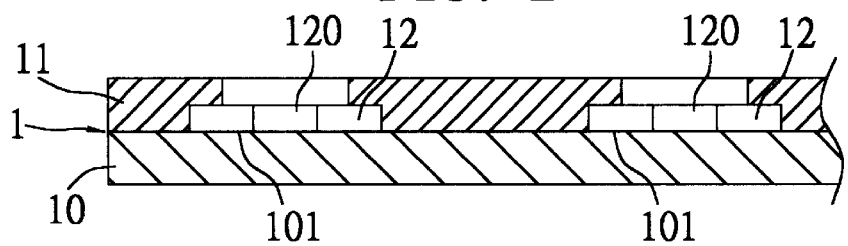
FIG. 2 is a cross-sectional view of FIG. 1 cutting along a line 2—2.

Referring to FIGS. 1 and 2, a substrate 1 of a first preferred embodiment of the invention comprises a core layer 10, a surface of which core layer 10 is defined with a chip attach area 100 and a trace forming area 101 surrounding the chip attach area 100. The trace forming area 101 allows a plurality of conductive traces (not shown) to be formed and routed thereon by using an etching technique, and the conductive traces are used to electrically connect a chip (not shown) to the substrate 1. Since the forming and routing of conductive traces employ conventional technology, they are not further described herein and illustrated in the drawings.

A solder mask layer 11 is applied on the trace forming area 101 of the core layer 10, so as to hermetically encapsulate the conductive traces formed on the trace forming area 101. Further, at least a pair of solder pads 12 are formed on the trace forming area 101 in a manner that, the solder pads 12 are partly exposed to outside of the solder mask layer 11, and electrically connected to a passive component (not shown). This allows the passive component to be electrically coupled to the substrate 1 by the solder pads 12. Since the solder pads 12 are made of metal such as copper by using conventional technology, no further description thereof is detailed herein.

The solder pads 12 are each formed with a cross recess 120 at a central position thereof, wherein the cross recess 120 is composed of a central recess with four symmetrically-arranged rib-like recesses extending from sides of the central recess toward a periphery of the solder pad 12, allowing part of the core layer 10 to be exposed through the cross recesses 120 of the solder pads 12.

Figure 3:
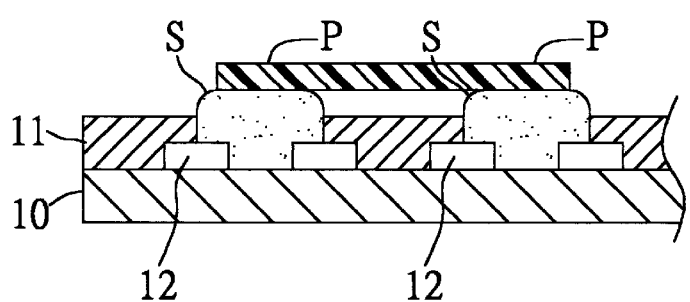
FIG. 3 is a cross-sectional view of FIG. 2 illustrating a passive component mounted on a pair of solder pads by means of solder paste.
Figure 4:
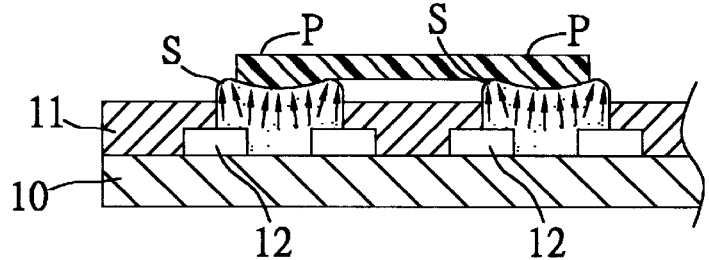
FIG. 4 is a cross-sectional view of FIG. 3 illustrating thermally-induced variation of solder paste in a reflow process.

Referring to FIG. 3, after the recesses 120 of the solder pads 12 are formed, solder paste S is applied onto the solder pads 12 for mounting a passive component P thereon. Then, a reflow soldering process is performed for electrically connecting the passive component P to the solder pads 12 by means of the solder paste S, in which thermally-induced variation of the solder paste S is generated, as shown in FIG. 4. In particular, during reflow soldering, the solder paste S comes into contact with the exposed part of the core layer 10 through the recesses 120. Since the solder paste S is not wettable with the material for making the core layer 10, it forms a recessed top surface due to surface tension of the solder paste S, and produces a downward and convergent dragging force for concentrating the solder paste S at central positions of the solder pads 12. This dragging force helps position the passive component P securely above the recesses 120 of the solder pads 12, so that the passive component P can be assured in no concern of position shifting during reflow, without coming into contact with other nearby elements or bonding wires (not shown). Further, the dragging force can also effectively and evenly drag the passive component P downwardly, allowing the passive component P to be firmly attached to the soldered solder paste S, thereby making the occurrence of tombstone effect desirably eliminated.

Therefore, as compared to the foregoing U.S. Pat. No. 5,311,405, the invention is more advantageous of forming a pair of solder pads on the substrate by adopting currently available equipment and processes; this in favor reduces and simplifies fabrication costs and processes, respectively. The invention is further beneficial for effectively preventing the occurrence of position shifting and tombstone effects on the passive component, thereby not undesirably affecting the trace routability of the substrate, and allowing the bonding quality between the passive component and the substrate to be well assured.

In addition, it is understood that, the substrate of the invention is generally structured of a core layer with a plurality of conductive traces formed thereon, for accommodating semiconductor devices and/or electronic elements on the substrate; that is, it can be a substrate normally used in a semiconductor package or a common printed circuit board. Also, the number of layers composing the substrate is not particularly limited; single-layer or multi-layer structure of the substrate can be suitably applied.

Figure 5:
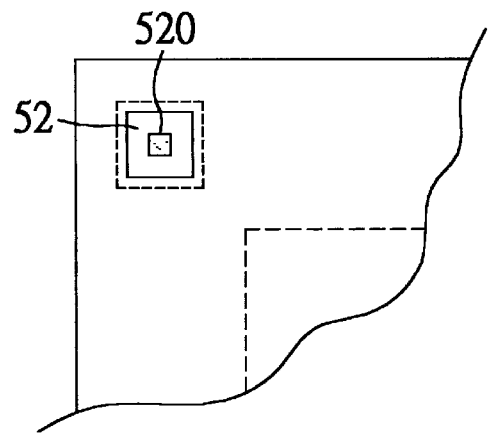
FIG. 5 is a top view of a substrate of a second preferred embodiment of the invention.
Figure 6:
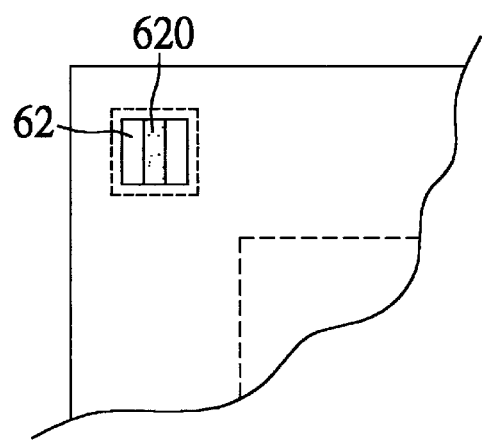
FIG. 6 is a top view of a substrate of a third preferred embodiment of the invention.
Figure 7:
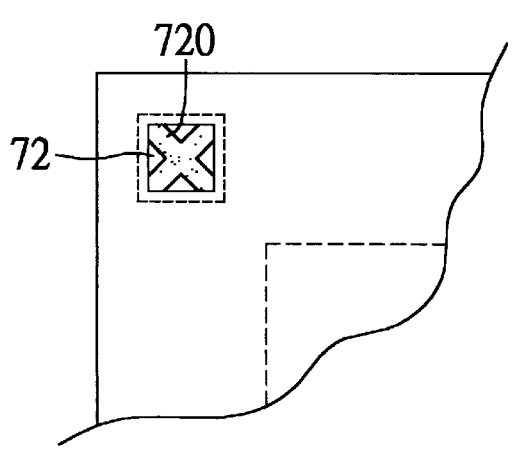
FIG. 7 is a top view of a substrate of a fourth preferred embodiment of the invention.
Figure 8:
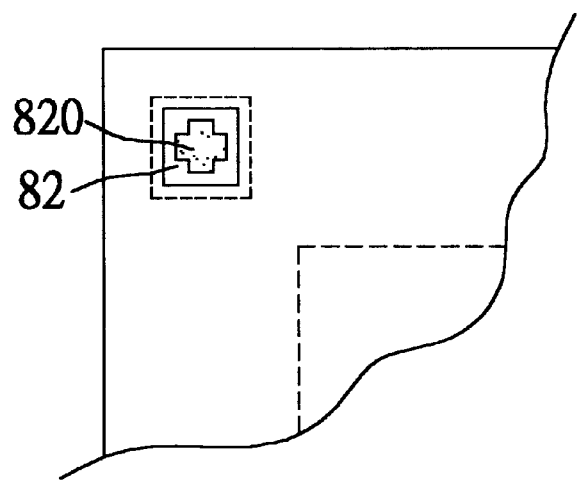
FIG. 8 is a top view of a substrate of a fifth preferred embodiment of the invention.
Figure 9:
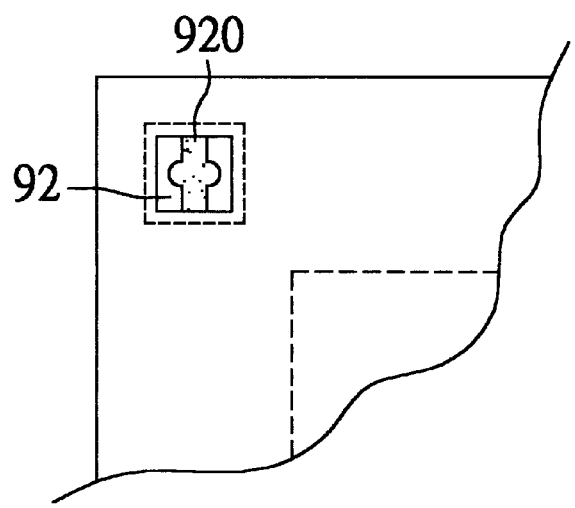
FIG. 9 is a top view of a substrate of a sixth preferred embodiment of the invention.

FIGS. 5 to 9 illustrate substrates of second to sixth preferred embodiments of the invention. The substrate of each of these embodiments is characterized differently from that of the first embodiment in the structural configuration of solder pads. It is noted that, at least a pair of solder pads are formed on the substrate in each embodiment, but only one solder pad is illustrated in the drawing for the sake of simplicity. As shown in FIG. 5, an recess 520 of a solder pad 52 is formed as a rectangular shape at a central position of the solder pad 52, but can also be in a circular shape. An recess 620 of a solder pad 62 shown in FIG. 6 is a strip-like recess passing through the center of the solder pad 62. FIG. 7 shows that an recess 720 of a solder pad 72 is structurally similar to that of the first embodiment, with the only difference of the recess 720 being formed as diagonal extensions that cross at a central position of the solder pad 72. As shown in FIG. 8, an recess 820 of a solder pad 82 is a cross structure with its ends not extending to reach a solder mask layer 81. Finally, referring to FIG. 9, an recess 920 of a solder pad 92 is dimensioned to be larger in diameter at a central position of the solder pad 92 than other part of the recess 920.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A substrate for accommodating a passive component, comprising:

a core layer having a surface being formed with a chip attach area for mounting a chip thereon, and a trace forming area surrounding the chip attach area, for disposing a plurality of conductive traces on the trace forming area;

a solder mask layer applied onto the trace forming area; and at least a pair of solder pads formed on the trace forming area and partly exposed to outside of the solder mask layer, each of the solder pads being formed with a central recess at least at a central position of the solder pad, allowing the core layer to be partly exposed through the central recesses of the solder pads.

2. The substrate of claim 1, wherein each of the solder pads is further formed with at least a pair of rib-like recesses that are symmetrically positioned in association with the central recess and extend from the central recess toward a periphery of the solder pad.

3. The substrate of claim 2, wherein the rib-like recesses are dimensionally equal in diameter to the central recess.

4. The substrate of claim 2, wherein the rib-like recesses are dimensionally smaller in diameter than the central recess.

5. The substrate of claim 1, wherein the central recess is of a rectangular shape.

6. The substrate of claim 1, wherein the central recess is of a circular shape.

7. The substrate of claim 1, wherein solder paste is applied on the pair of the solder pads for bonding a passive component to the solder pads.

8. The substrate of claim 7, wherein the passive component is reflow-soldered to the solder pads.

* * * * *